(12) United States Patent
Wang et al.

(10) Patent No.: US 12,020,745 B2
(45) Date of Patent: Jun. 25, 2024

(54) MEMORY ARRAY ARCHITECTURE HAVING SENSING CIRCUITRY TO DRIVE TWO MATRICES FOR HIGHER ARRAY EFFICIENCY

(71) Applicant: Micron Technology, Inc., Boise, ID (US)

(72) Inventors: Hongmei Wang, Boise, ID (US); Soichi Sugiura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 135 days.

(21) Appl. No.: 17/842,492

(22) Filed: Jun. 16, 2022

(65) Prior Publication Data

US 2023/0410895 A1    Dec. 21, 2023

(51) Int. Cl.
*G11C 11/40* (2006.01)
*G11C 11/4091* (2006.01)
*G11C 11/4097* (2006.01)

(52) U.S. Cl.
CPC ...... *G11C 11/4097* (2013.01); *G11C 11/4091* (2013.01)

(58) Field of Classification Search
None
See application file for complete search history.

(56) References Cited

U.S. PATENT DOCUMENTS

| | | | | |
|---|---|---|---|---|
| 6,091,620 A * | 7/2000 | Kablanian | ............... | G11C 5/025 365/72 |
| 7,184,290 B1 * | 2/2007 | Lee | ...................... | G11C 11/4094 365/72 |
| 7,457,143 B2 * | 11/2008 | Lehmann | ............. | G11C 7/1012 365/230.03 |
| 8,570,819 B2 * | 10/2013 | McCollum | ............. | G11C 16/26 365/207 |
| 2008/0037309 A1 * | 2/2008 | Makino | ............... | G11C 11/4097 365/207 |
| 2011/0069570 A1 * | 3/2011 | Katoch | ................... | G11C 7/062 365/207 |
| 2016/0005455 A1 * | 1/2016 | Vogelsang | .......... | G11C 11/4091 365/189.011 |
| 2022/0367473 A1 * | 11/2022 | Sakui | .................... | G11C 11/406 |

* cited by examiner

*Primary Examiner* — Tan T. Nguyen
(74) *Attorney, Agent, or Firm* — Fletcher Yoder, P.C.

(57) ABSTRACT

An apparatus may include a first matrix comprising a first plurality of digit lines, a second matrix comprising a second plurality of digit lines, a plurality of sense amplifiers, and a plurality of selector circuits. Each selector circuit of the plurality of selector circuits may be configured to selectively couple a respective sense amplifier to either a first digit line of the first plurality of digit lines or a second digit line of the second plurality of digit lines.

24 Claims, 4 Drawing Sheets

MEMORY ARRAY ARCHITECTURE HAVING SENSING CIRCUITRY TO DRIVE TWO MATRICES FOR HIGHER ARRAY EFFICIENCY

BACKGROUND

Field of the Present Disclosure

Embodiments of the present disclosure relate generally to the field of semiconductor devices. More specifically, embodiments of the present disclosure relate to a memory cell sub-array architecture with sensing circuitry to drive two matrices to enable higher array efficiency of the semiconductor device.

Description of the Related Art

Electronic devices, such as semiconductor devices, memory chips, microprocessor chips, image chips, and the like, may include a plurality of memory banks, each with a memory cell sub-array that performs operations (e.g., read, write, or store data) for the electronic device. For example, the memory cell sub-array may include a storage device, such as a capacitor, that communicates with a sense amplifier through a data line (e.g., digit line). Typically, the capacitor stores data with its charge state (e.g., a charged capacitor may represent a logic value of "1" while an uncharged capacitor may represent a logic value of "0.") To read data from the capacitor, a switch (e.g., transistor) between the capacitor and the data line is closed, and electrons flow between the capacitor and the data line, thereby changing the voltage of the data line (e.g., Vsignal). The change in voltage is typically registered by the sense amplifier, which may categorize the change in voltage as indicating either that the capacitor is storing a 0 or a 1.

Often, data lines have a relatively large capacitance compared to the capacitor storing data. In some designs, a single data line may service a plurality of capacitors. These data lines may be relatively long, extending in some designs, across an entire block of memory. However, the length of a data line may be limited by a ratio of capacitor's capacitance to the data line's capacitance. The ratio should be above a pre-determined value in order for the sensing circuitry (e.g., sense amplifier) to register a voltage, thereby limiting the length of the data lines. Additionally, the capacitance of the data lines and/or storage components may couple, or charge sharing may occur further impacting the sense amplifier's operation. As such, the data line length may be limited.

Furthermore, electronic devices are being scaled smaller, which further limits the data line length. Scaling may also shrink the size of the capacitor, thereby further limiting the ability to provide enough charge to the capacitor to allow for proper sensing along longer data lines. Regardless of data line length, one sense amplifier may drive one data line, thereby occupying valuable real estate within the memory cell sub-array. Sense amplifiers are generally large, and therefore occupy valuable real estate that may otherwise be used for storage components within a memory matrix and/or data lines. As such, the data line length may be limited and efficiency of the memory cell sub-array may be sub-optimal.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, an electronic device may include a plurality of memory banks, each with one or more memory cell sub-arrays. The sub-array may include a matrix coupled to sensing circuitry (e.g., sense amplifiers) to perform read or write operations. The matrix may include a plurality of digit lines, a plurality of word lines, and a plurality of memory cells to store data. Each digit line may be connected to a plurality of memory cells, which store data with a charged state. The sense amplifier is connected to a digit line of the matrix to register a voltage of the digit line, thereby reading the state of the capacitor. Longer digit lines may improve array efficiency, as one sense amplifier may drive the one digit line regardless of the digit line length. However, because sense amplifiers are generally large and thus, occupy valuable real estate on the memory device that could otherwise be used for storage components (e.g., memory cells), minimizing the number of sense amplifiers in the memory cell sub-array (or increasing the number of memory cells of a matrix coupled to a particular digit line driven by a particular sense amplifier) will free valuable real estate for additional memory cells or allow for the overall size of the sub-array to be reduced.

The digit line length may be limited by the sense amplifier's ability to accurately register a voltage of the digit line.

Digit lines have a relatively large capacitance compared to that of the memory cell (e.g., a capacitor) storing data. Additionally, along their length, the digit line may couple to other conductors that are at different voltages, such as other digit lines, word lines, or memory cells, which may increase the digit line's capacitance. In order for the sense amplifier to accurately register the voltage of the digit line, a ratio between the capacitor's capacitance and the digit line's capacitance should be above a pre-determined value. The capacitor's capacitance may be defined by a property (e.g., size, material) of the capacitor, while the digit line's capacitance may be influenced by components of the memory cell sub-array. A longer digit line may also have a larger capacitance. For the sense amplifier to accurately register a voltage, the digit line length may be limited to reduce coupling or improve charge sharing within the sub-array. As such, overall sub-array efficiency may be sub-optimal.

In an embodiment of the presently described invention, the memory cell sub-array may include two memory cell matrices and sense amplifiers connected to respective digit lines of each matrix by a respective bridge. Each matrix may be approximately the same size as a typical matrix. One sense amplifier may be used to selectively drive digit lines of both matrices using selector circuitry, such as a multiplexor (MUX). For example, a first matrix and a second matrix may each include a plurality of word lines, a plurality of digit lines, and a plurality of memory cells. The sense amplifier and the MUX may be connected to a digit line of the first matrix and the bridge may connect the sense amplifier and the MUX to a digit line of the second matrix. The MUX may selectively switch the sense amplifier's operation between the first matrix and the second matrix based on an address from a memory controller. In this way, one sense amplifier may be used to selectively drive two matrices within the memory cell sub-array. As such, the sub-array efficiency may increase by reducing the number of sense amplifiers by approximately 50%.

While the bridge connects the sense amplifier to both matrices, the matrices may be electrically separated, thereby containing coupling and/or charge sharing within each matrix. Each matrix may have similar coupling and/or charge sharing properties as a typical matrix. As such, digit line capacitance may remain the same or similar. Each bridge may be added in a plane (e.g. vertically stacked) above one matrix with several layers in between the two to prevent coupling or charge sharing. In one embodiment, each bridge may be formed parallel to a respective digit line of the underlying matrix. In other words, the bridge may simply be a conductive pathway for the sense amplifier to reach a digit line of another matrix. That is, the sense amplifier may be selectively coupled to directly to a digit line of the first matrix using selector circuitry, such as a MUX, and selectively couple to a digit line of the second matrix through a respective bridge using the selector circuitry, or vice versa. The bridge may provide little to no capacitance to the digit line or influence sense amplifier operations. As such, each matrix of the memory cell sub-array may have properties similar to a typical matrix. However, one sense amplifier may be used to drive both matrices, which increases overall sub-array efficiency.

Figure 1:
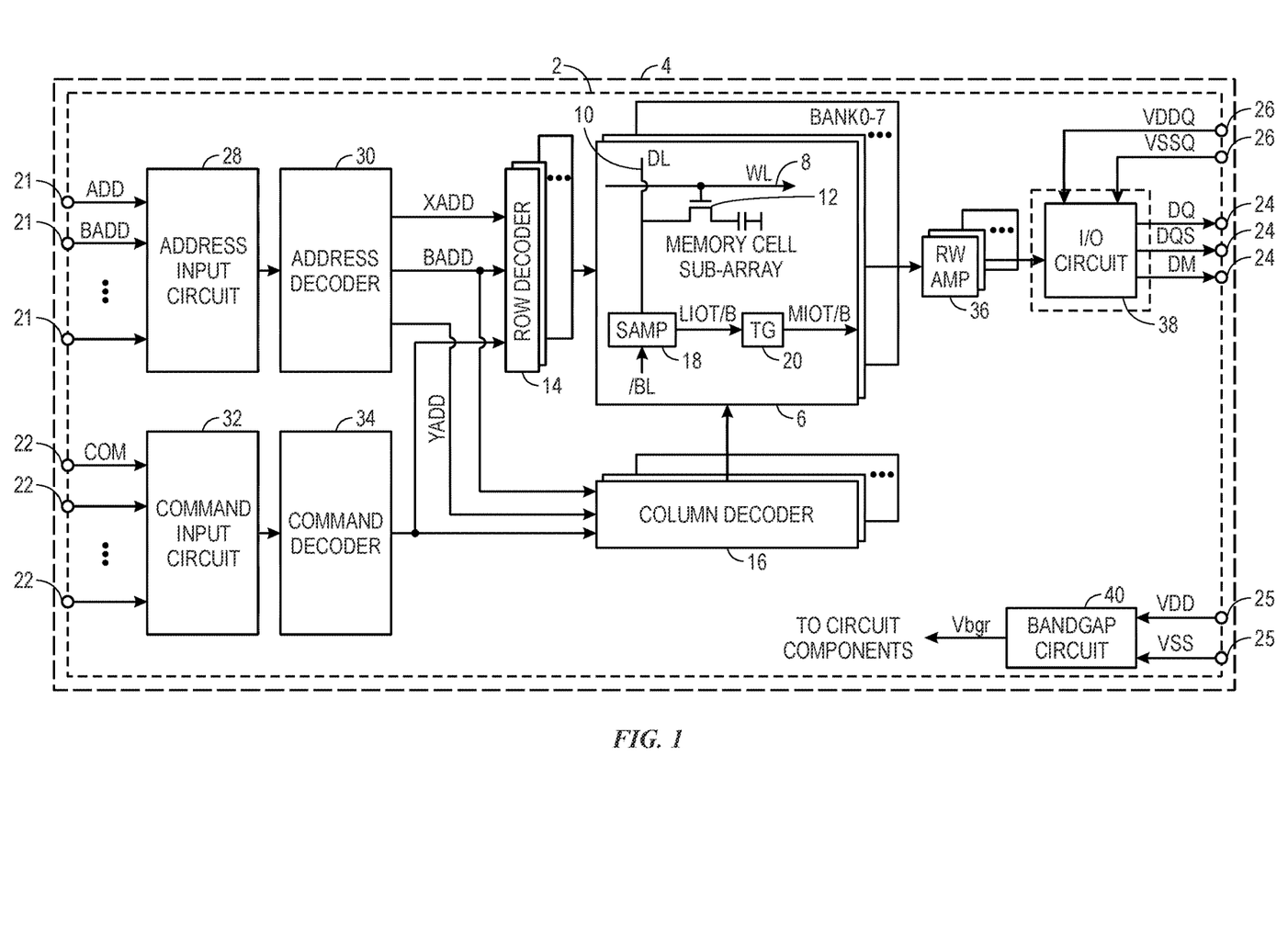
FIG. 1 is a simplified block diagram illustrating a semiconductor device that includes a memory cell sub-array architecture with two matrices, in accordance with an embodiment of the present disclosure.

With the foregoing in mind, FIG. 1 is a block diagram of a semiconductor device in accordance with an embodiment of the present disclosure. That is, for example, the semiconductor device 2 may include a memory cell sub-array with a two matrices to improve array efficiency. Although the following description of the semiconductor device and the memory cell sub-array will be described in the context of a memory device, it should be noted that the embodiments described herein regarding the memory cell sub-array with two matrices driven by the same sensing circuitry may be employed for any suitable electronic device. Indeed, the description of the memory device below is provided to explain certain aspects of the memory cell sub-array including two matrices, sensing circuitry, selector circuitry and bridges of the present disclosure, and, as such, the embodiments described herein should not be limited to memory devices.

Referring now to FIG. 1, a semiconductor device 2 may be any suitable memory device, such as a low power double data rate type 4 (LPDDR4) synchronous dynamic random access memory (SDRAM) integrated into a single semiconductor chip, for example. A plurality of semiconductor devices 2 (e.g., x4, x8 or x16) may be mounted on an external substrate 4 that is a memory module substrate, such as a dual inline memory module (DIMM), a mother board or the like. The semiconductor device 2 may include a plurality of memory banks (e.g., 8, 16 or 32) each having a memory cell sub-array 6. As discussed herein, the memory cell sub-array 6 may include two matrices (MATs), in accordance with embodiments of the present invention. As will be further described below with regard to FIGS. 3 and 4, each MAT may include a plurality of word lines (WL) 8, a plurality of digit lines (DL) 10, and a plurality of memory cells (MC) 12 arranged at intersections of the plurality of WL 8 and the plurality DL 10. The selection of the WL 8 is performed by a row decoder 14 and the selection of the DL 10 is performed by a column decoder 16. Sense amplifiers SAMP 18 are coupled to corresponding DLs 10 and connected to local input/output (I/O) line pairs LIOT/B. As will be described below, by incorporating a selector circuit and a bridge, each SAMP 18 may be used to drive the memory cell sub-array 6, which includes two MATs that individually include a plurality of DLs 10. Local IO line pairs LIOT/B are connected to main IO line pairs MIOT/B via transfer gates TG 20 which function as switches.

Turning to the explanation of a plurality of external terminals included in the semiconductor device 2, the plurality of external terminals includes address terminals 21, command terminals 22, data strobe (DQS) and data (DQ) terminals 24 and power supply terminals 25 and 26. The data terminals 24 may be coupled to output buffers for read operations of memories. Alternatively, the data terminals 24 may be coupled to input buffers for read/write access of the memories.

The address terminals 21 are supplied with an address signal ADD and a bank address signal BADD. The address signal ADD and the bank address signal BADD supplied to the address terminals 21 are transferred via an address input circuit 28 to an address decoder 30. The address decoder 30 receives the address signal ADD and supplies a decoded row address signal XADD to the row decoder 14, and a decoded column address signal YADD to the column decoder 16. The address decoder 30 also receives the bank address signal BADD and supplies the bank address signal BADD to the row decoder 14 and the column decoder 16.

The command terminals 22 are supplied with a command signal COM. The command signal COM may include one or more separate signals. The command signal COM input to the command terminals 22 is input to a command decoder 34 via the command input circuit 32. The command decoder 34 decodes the command signal COM to generate various internal command signals. For example, the internal commands may include a row command signal to select a word line and a column command signal, such as a read command or a write command, to select a digit line. In another example, the internal commands may include a sub-array signal to distinguish between the word lines and/or digit lines of a first sub-array and a second sub-array.

Although the address terminals 21 and the command terminals 22 are illustrated in FIG. 1 as being separate terminals, it should be noted that in some embodiments the address input circuit 28 and the command input circuit 32 may receive address signals ADD and command signals COM via one or more address and command terminals. That is, the address signals ADD and command signals COM may be provided to the semiconductor device 2 via the same terminal. For instance, the address and command terminals may provide an address signal at a falling clock edge (e.g., in synchronism with clock falling edge) and a command signal at a rising clock edge (e.g., in synchronism with clock rising edge). With this in mind, it should be understood that the description provided in the present disclosure with the separate address terminals 21 and command terminals 22 is included for discussion purposes and the techniques described herein should not be limited to using separate address terminals 21 and command terminals 22.

Accordingly, when a read command is issued and a row address and a column address are timely supplied with the read command, read data is read from a MC 12 in the memory cell sub-array 6 designated by these row address and column address. The read data DQ is output externally from the data terminals 24 via a read/write amplifier 36 and an input/output (IO) circuit 38. Similarly, when the write command is issued and a row address and a column address are timely supplied with the write command, and then write data DQ is supplied to the data terminals 24, the write data DQ is supplied via the input/output circuit 38 and the read/write amplifier 36 to the memory cell sub-array 6 and written in the MC 12 designated by the row address and the column address.

The input/output circuit 38 may include input buffers, according to one embodiment. The input/output circuit 38 receives external clock signals as a timing signal for determining input timing of write data DQ and output timing of read data DQ. Power supply potentials VDDQ and VSSQ are supplied to the input/output circuit 38. The power supply potentials VDDQ and VSSQ may be the same potentials as power supply potentials VDD and VSS that are supplied to power supply terminals 25, respectively. However, the dedicated power supply potentials VDDQ and VSSQ may be used for the input/output circuit 38 so that power supply noise generated by the input/output circuit 38 does not propagate to the other circuit blocks.

The power supply terminals 25 are supplied with power supply potentials VDD and VSS. These power supply potentials VDD and VSS are supplied to a bandgap circuit 40. In some embodiments, the bandgap circuit 40 may be a voltage reference circuit that outputs a constant (e.g., fixed) voltage independent of power supply variations, temperature changes, circuit loading, process variations, and the like.

The bandgap circuit 40 may, in some embodiments, generate various internal potentials VPP, VOD, VARY, VPERI, and the like to provide to various circuit components of the semiconductor device 2. For example, the internal potential VPP may be mainly used in the row decoder 14, the internal potentials VOD and VARY may be mainly used in the SAMPs 18 included in the memory cell sub-array 6, and the internal potential VPERI may be used in many other circuit blocks.

Figure 2:
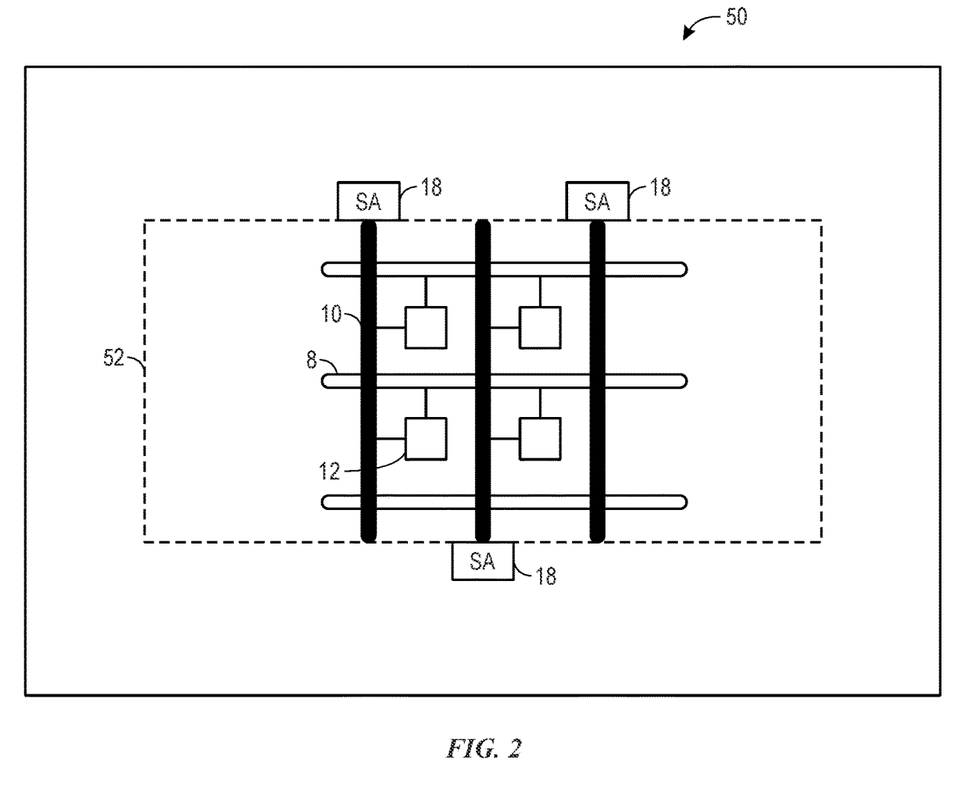
FIG. 2 is a schematic diagram illustrating a top view of a memory cell sub-array architecture that may be employed in a semiconductor device.

FIG. 2 illustrates a schematic diagram of a portion of a memory cell sub-array 50 and a portion of a matrix (MAT) 52. The MAT 52 may include a plurality of word lines (WL) 8, a plurality of digit lines (DL) 10, and a plurality of memory cells (MC) 12 arranged at the intersections and coupled to a DL 10 and a WL 8. A length of the DL 10 may be approximately 30 micrometers, for instance. The memory cell sub-array 50 may include sense amplifiers (SAMPs) 18 coupled to every DL 10 of the MAT 52 to register a change in voltage (Vsignal). As will be appreciated, each SAMP 18 may be connected to a respective the DL 10 to register a voltage of any of the MCs 12 coupled to the DL 10. The SAMP 18 is configured to sense and amplify the signals on its respective DL 10, and thus, is used to sense the state (i.e., 0 or 1) of each MC 12 on the respective DL 10. To save real estate within the memory cell sub-array 50, the SAMPs 18 are arranged to alternatingly connect to the DLs 10 at a top edge and a bottom edge of the memory cell sub-array 50. For example, a SAMP 18 may connect to a DL 10 (e.g., an odd DL, such as DL1, DL3, DL5, etc.) at the top edge and the DL 10 adjacent to the first DL 10 (e.g., an even DL, such as DL0, DL2, DL4, etc.) may be connected to a SAMP 18 at the bottom edge of the memory cell sub-array 50, as illustrated. However, as previously described, since the SAMP 18 is large, the SAMP 18 may take up valuable real estate within the memory cell sub-array 6 (FIG. 1) that might otherwise be used for adding storage capacity (e.g., more memory cells) or, alternatively prevent size reduction of the memory sub-array compared to devices with fewer SAMPs 18.

Figure 3:
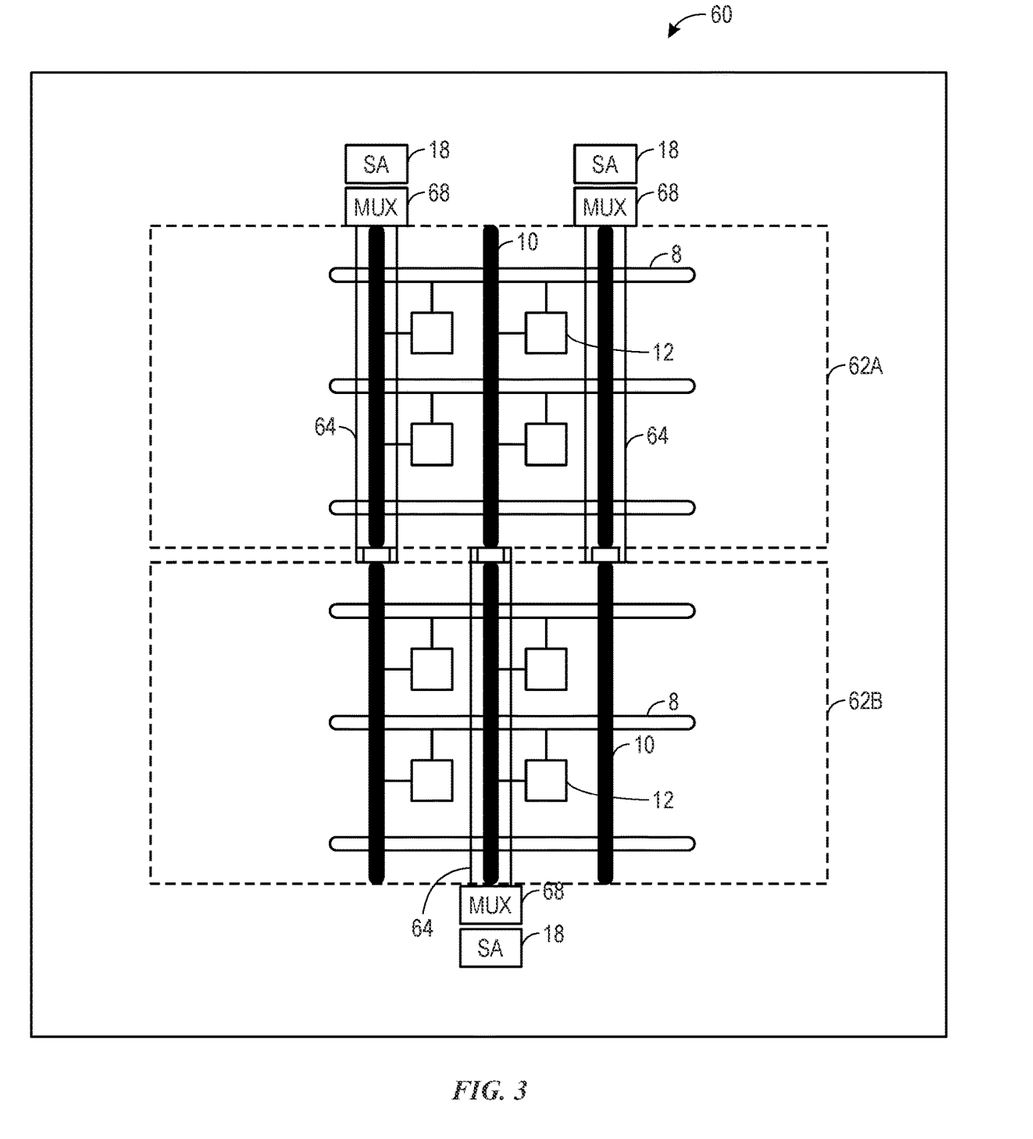
FIG. 3 is a schematic diagram illustrating a top view of the memory cell sub-array architecture having sensing circuitry for driving two matrices that may be employed in the semiconductor device of FIG. 1, in accordance with an embodiment of the present disclosure.

In accordance with embodiments of the present invention, FIG. 3 illustrates a schematic diagram of a portion of a more efficient memory cell sub-array architecture with two matrices (MATs). The memory cell sub-array 60 (which may be the same as memory cell sub-array 6) includes a first MAT 62a and a second MAT 62b. Each MAT 62 may include a plurality of word lines (WL) 8, a plurality of digit lines (DL) 10, and a plurality of memory cells (MC) 12 arranged at the intersections. The number of WLs 8, DLs 10, and MCs 12 of the MAT 62 may be the same or approximately the same as the number of WLs 8, DLs 10, and MCs 12 of the MAT 52, described above. Further, a length of the DLs 10 of the MAT 62 may be approximately 30 micrometers, or approximately the same length as the DLs 10 of the MAT 52. The DLs 10 may service a plurality of capacitors, or MCs 12. The MC 12 may include a switch (e.g., a transistor) and a storage component (e.g., a capacitor) that stores data corresponding to a charged or uncharged state (e.g., logic value "1" or logic value "0"). In a different plane (e.g., above the active area of the MAT 62), the memory cell sub-array 6 may include a bridge 64 to allow sense amplifiers (SAMPs) 18 to drive both MATs 62a and 62b, described in greater detail below with respect to FIG. 4.

Similar to the memory cell sub-array 50, the SAMPs 18 may respectively couple to every DL 10 of the memory cell sub-array 60 to register the Vsignal. The SAMP 18 may couple to the DLs 10 by an alternating arrangement between a top edge and a bottom edge of the memory cell sub-array 60. For instance, each SAMP 18 arranged at the top edge of the memory cell sub-array 60 may be coupled to an odd DL 10 in each MAT 62, and each SAMP 18 arranged at the bottom edge of the memory cell sub-array 60 may be coupled to an even DL 10. As discussed, because the memory cell sub-array 60 includes two MATs 62, each SAMP 18 may be coupled to a DL 10 in each of the first MAT 62a and the second MAT 62b. In accordance with the embodiments described herein, a selector, such as a multiplexor (MUX) 68, is provided to selectively couple each SAMP 18 to a respective DL 10 in each of the MATs 62.

That is, each SAMP 18 is coupled to a respective DL in each MAT 62*a* and 62*b*, utilizing a corresponding MUX 68. The MUX 68 may receive an address (e.g., row address, column address) from a memory controller to energize a desired MC 12 on a DL 10. For example, a first, last, or other digit, or group of digits of the address may determine which MAT 62, and further, which MC 12 to energize. The MUX 68 may determine whether the address corresponds to the first MAT 62*a* or the second MAT 62*b* and selectively couple the SAMP 18 to a desired MAT 62 to sense the voltage of the corresponding DL 10. In some embodiments, a first, last, or other digit, or group of digits of the address may determine which sub-array and/or which memory cell 56 is energized.

By way of example, the MUX 68 may be utilized to selectively couple the SAMP 18 arranged at a top portion of the memory sub-array 60 to a DL 10 (e.g., odd DL) of the first MAT 62*a* or to the bridge 64 of the second MAT 62*b*. The bridge 64 may provide a low capacitance pathway for the SAMP 18 to access a DL 10 of the second MAT 62*b* to register a voltage. The bridge 64 may include a passing (e.g., passive) DL that extends through (e.g., above) the first MAT 62*a* to and coupled with a vertical contact that is coupled to the DL 10 of the second MAT 62*b*. As used herein, the "passing DL" may be a passive DL that is not coupled to any MCs 12 and has little to no capacitance. Thus, the passing DL may be a conductive trace arranged above the underlying active DL 10 of the corresponding MAT 62. In one embodiment, the passing DL may be arranged above and parallel to a corresponding DL 10, and may have a width (e.g., pitch) that is approximately twice that of the underlying DL 10. The contact may be a passing gate or a passing metal, which also has little to no capacitance. The contact may be a vertical conductive via (e.g., metal) that electrically couples the passing DL in a plane of one MAT 62 (e.g., MAT 62*a*) to the active DL 10 in another plane of the other MAT 62 (e.g., MAT 62*b*). As such, the bridge 64, which includes a passing DL and contact, may not influence the DL capacitance, the matrices capacitance, or SAMP 18 operations. Additionally or alternatively, the SAMP 18 and the MUX 68 may be arranged at a bottom portion of the memory cell sub-array 60 and coupled to a DL 10 (e.g., even DL) of the second MAT 62*b* or the bridge 64 may couple the SAMP 18 to a DL 10 of the first MAT 62*a*. It should be appreciated that in both examples, one SAMP 18 may drive the DLs 10 of both the first MAT 62*a* and the second MAT 62*b*.

As described, each MAT 62 may include the same number of WLs 8, DLs 10 and MCs 12 as the MAT 52 of FIG. 2, and thus, combining the two MATs 62 includes twice as many MCs 12 within memory cell sub-array 60 as compared to memory cell sub-array 50. However, in accordance with the present embodiments, the same number of SAMPs 18 may be employed to operate the memory cell sub-array 60, as in the memory cell sub-array 50. Because the memory cell sub-array 60 includes two MATs 62, and thus, twice the number of MCs 12 as the memory cell sub-array 50, the architecture of the memory cell sub-array 60 is more efficient since each SAMP 18 supports twice as many MCs 12. Conversely, only half the number of SAMPs 18 may be used to support the same number of MCs 12 in the memory cell sub-array 60, compared to the number of SAMPs 18 in the memory cell sub-array 50. As such, valuable real estate within the memory cell sub-array 60 may be used for additional storage components, shrinking the memory cell sub-array, and overall memory cell sub-array efficiency is improved.

While the illustrated embodiment includes three WLs 8, three DLs 10, and four MCs 12, as appreciated, the depiction is merely for simplicity and any suitable number of WLs 8, DLs 10, and MCs 12 may be employed. It should be appreciated that regardless of the number of DLs 10, there may be one SAMP 18 connected to one DL 10 of the memory cell sub-array 60 (i.e., one DL 10 of the memory cell sub-array 60 includes one DL 10 of the first MAT 62*a* and one DL of the second MAT 62*b*). Further, while the illustrated embodiment describes the memory cell sub-array 60 with a MUX 68 to switch SAMP 18 operation between the MATs 62*a* and 62*b*, in other embodiments, the MUX 68 may be any suitable selection circuitry that may selectively switch the SAMP 18 operation between the MATs 62*a* and 62*b*. Further, while two MATs 62 are illustrated in the memory cell sub-array 60, it may be possible to employ additional MATs 62 in the memory cell sub-array 60, such that each SAMP 18 and corresponding selector circuit (e.g., MUX 68) may be used to drive a respective DL 10 in more than two MATs 62.

Figure 4:
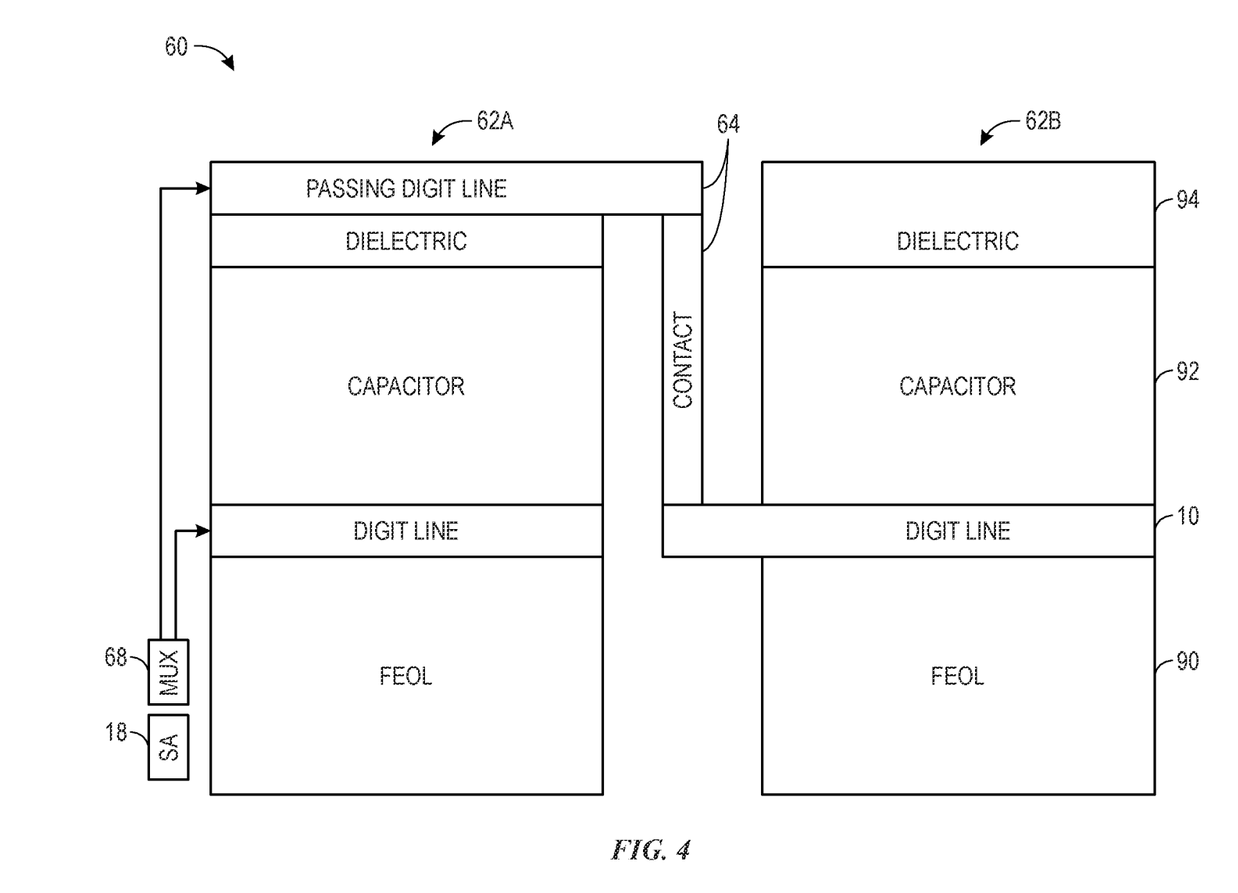
FIG. 4 is a schematic diagram illustrating a partial cross-sectional view of the memory cell sub-array architecture of FIG. 3, in accordance with an embodiment of the present disclosure.

FIG. 4 illustrates a schematic diagram of a partial cross-sectional view of the memory cell sub-array 60 (which may be the same as the memory cell sub-array 6). A first layer of the memory cell sub-array 60 may be a front end of line (FEOL) region 90 that includes a silicon substrate with a plurality of WLs 8, an adjacent source/drain region, and one or more polyplugs over the source/drain region. The FEOL region 90 may also include the MCs 12, access transistors, one or more metal connections, channel regions, or the like. The FEOL region 90 may be known as an active area with one or more conductive pathways or conductive components. In certain embodiments, the FEOL region 90 may include all manufacturing processes before the DL 10 process.

Indeed, a plurality of DLs 10 may be within a layer through or above the FEOL region 90. As described herein, a SAMP 18 and a MUX 68 may be coupled to a DL 10 to perform voltage readings. Directly above the DL 10 layer may be a stacked redistribution layer (RDL) 92 having the MC capacitors formed therein (e.g., vertical trench capacitors—not shown), a dielectric layer 94 for electrical isolation, and a layer with the bridge 64. The bridge 64 may include a metal layer above the dielectric layer 94 and a vertical contact. The RDL 92 and the dielectric layer 94 may nonconductive layers and electrically isolate the layer with DLs 10 from the bridge 64. As such, capacitive coupling or charge sharing between the DL 10 and the bridge 64 may be reduced or eliminated.

In the illustrated example of FIG. 4, the bridge 64 may extend from the first MAT 62*a* to the second MAT 62*b*, however, as described herein, the bridge 64 may also extend from the second MAT 62*b* to the first MAT 62*a*, depending on whether the SAMP 18 is coupled to an even DL 10 or an odd DL 10, for instance. The bridge 64 may include a passing (e.g., passive) DL and a contact. The passing DL may be a passive DL that may not be connected to any capacitors or MCs 12, rather the passing DL simply provides a low capacitance pathway from one MAT to another MAT. A pitch size of the passing DL may be double a pitch size of the DLs 10 to optimize signal resolution of the SAMP 18. The contact may be a passing gate or a passing metal that also provides a low capacitance pathway. As such, the bridge 64 may be a conductive pathway, or a bridge, for the SAMP 18 to perform operations on DLs 10 of the second MAT 62*b*. Further, while the bridge 64 is illustrated as including only a single vertical contact, each bridge 64 may include multiple conductive traces in multiple vertical planes, electrically coupled to one another through vertical contacts. That is, the bridge 64 may include any number of passive conductive elements used to couple a SAMP 18 to a DL 10.

Although the bridge 64 connects the SAMP 18 to both MATs 62, the first MAT 62a and the second MAT 62b are electrically separated. The RDL 92 and the dielectric layer 94 electrically separate the bridge 64 from the DLs 10 and the bridge 64 provides little to no capacitance to the DLs 10. As such, the capacitance of each MAT may be approximately the same as that of a typical MAT. Further, Vsignal is not compromised by doubling the number of MATs 62 within the memory cell sub-array 60 due to the electrical separation. For example, the DLs 10 may be precharged with a voltage of approximately 0.5V. A transistor on the DL 10 may close to allow voltage of the MC 12 into the DL 10. Due to the electrical separation, the Vsignal may be contained within the MAT and the SAMP 18 may accurately register the voltage.

Further, the DL capacitance may be determined by the capacitance of the MAT 62 rather than by the entire memory cell sub-array 60. As discussed herein, a DL length may be limited by a ratio of the capacitor's capacitance to the digit line's capacitance. The ratio should be above a pre-determined value for the SAMPs 18 to accurately register the voltage. By way of example, the capacitance of the MAT 62 and/or the total DL's capacitance may be approximately 17 attoFarad per cell (aF/cell). The majority of the DL's capacitance may come from contact between the DL 10 to the polyplug in the FEOL region 90. The polyplug may connect a capacitor, a DL 10, or other conducting layers within the FEOL region 90. The polyplug may be made of conductive material, such as polysilicon. The DL 10 to polyplug capacitance may be approximately 14 aF/cell. Additionally or alternatively, there may be DL capacitance between two DLs 10 of approximately 0.4 aF/cell. There may also be a capacitance between the plurality of DLs 10 and the plurality of WLs 8 of approximately 2.6 aF/cell. In contrast, the bridge 64 generates little to no DL capacitance due to the electrical isolation between the bridge 64 and the DLs 10. A total capacitance of the bridge 64 may be significantly smaller than a regular digit line capacitance (<0.01 aF/cell). The impact of the bridge 64 capacitance on the overall DL's capacitance is negligible. Accordingly, the SAMP 18 may accurately perform operations on the DLs 10 of the first MAT 62a and the second MAT 62b, with or without the bridge 64.

With the memory cell sub-array architecture including two MATs 62, the number of SAMPs 18 may be reduced by or eliminated by 50%. By doing so, valuable real estate within the memory cell sub-array 60 may be used for storage components (e.g., MCs), additional DLs or WLs, thereby improving the efficiency of the memory cell sub-array. Even with the addition of the MUX 68 to the memory cell sub-array 60, the memory cell sub-array 60 may be approximately 35% smaller than previous systems (or additional MCs may be added). Accordingly, by having one SAMP 18 drive two MATs 62, memory cell sub-array efficiency may improve.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
   a first matrix comprising a first plurality of digit lines;
   a second matrix comprising a second plurality of digit lines;
   a plurality of sense amplifiers;
   a plurality of selector circuits, wherein each selector circuit of the plurality of selector circuits is configured to selectively couple a respective sense amplifier to either a first digit line of the first plurality of digit lines and a second digit line of the second plurality of digit lines; and
   a plurality of bridges, wherein each bridge is coupled to a respective sense amplifier of the plurality of sense amplifiers and a respective selector circuit of the plurality of selector circuits.

2. The apparatus of claim 1, wherein a first number of respective sense amplifiers are each connected to a respective digit line of the first plurality of digit lines of the first matrix and a respective bridge of the plurality of bridges, wherein the respective bridge is connected to a respective digit line of the second plurality of digit lines of the second matrix.

3. The apparatus of claim 2, wherein the first number of respective sense amplifiers are arranged closer to the first matrix than to the second matrix.

4. The apparatus of claim 2, wherein a second number of respective sense amplifiers are each connected to a respective digit line of the second plurality of digit lines of the second matrix and a second respective bridge of the plurality of bridges, wherein the second respective bridge is connected to a respective digit line of the first plurality of digit lines of the first matrix.

5. The apparatus of claim 2, wherein each bridge of the plurality of bridges comprises a passing digit line and a vertical contact.

6. The apparatus of claim 5, wherein the passing digit line comprises a conductive path arranged vertically above and parallel to first digit line of the first matrix.

7. The apparatus of claim 6, wherein the vertical contact is configured to electrically couple the passing digit line of the first matrix to the second digit line of the second matrix.

8. The apparatus of claim 5, wherein the vertical contact is arranged between the first matrix and the second matrix.

9. The apparatus of claim 5, wherein the passing digit line comprises twice a pitch size of the first digit line.

10. The apparatus of claim 1, wherein each sense amplifier of the plurality of sense amplifiers is configured to selectively drive each of the first digit line and the second digit line.

11. The apparatus of claim 1, wherein each selector circuit comprises a multiplexor.

12. An apparatus, comprising:
    a memory sub-array comprising:
       a first matrix comprising a first digit line;

a second matrix comprising a second digit line;
a first multiplexor;
a first sense amplifier selectively couplable to each of the first digit line and the second digit line via the first multiplexor; and
a first bridge, wherein the first bridge comprises a first passive digit line vertically above the first digit line and a first vertical contact electrically coupled between the first passive digit line and the second digit line.

13. The apparatus of claim 12, wherein the first vertical contact is arranged adjacent to and between the first matrix and the second matrix.

14. The apparatus of claim 12, wherein the first sense amplifier is arranged closer to the first matrix than to the second matrix.

15. The apparatus of claim 12, wherein:
the first matrix comprises a third digit line directly adjacent to the first digit line;
the second matrix comprises a fourth digit line directly adjacent to the second digit line;
a second multiplexor;
a second sense amplifier selectively couplable to each of the third digit line and the fourth digit line via the second multiplexor; and
a second bridge, wherein the second bridge comprises a second passive digit line vertically above the fourth digit line and a second vertical contact electrically coupled between the second passive digit line and the third digit line.

16. The apparatus of claim 15, wherein the second vertical contact is arranged adjacent to and between the first matrix and the second matrix.

17. The apparatus of claim 15, wherein the second sense amplifier is arranged closer to the second matrix than to the first matrix.

18. The apparatus of claim 15, wherein the first digit line and the second digit line are odd digit lines, and wherein the third digit line and the fourth digit line are even digit lines.

19. An apparatus, comprising:
a first memory matrix comprising a first digit line configured to store a first voltage charge from one or more capacitors;
a passing digit line arranged above and parallel to the first digit line;
a second memory matrix comprising a second digit line configured to store a second voltage charge from the one or more capacitors; and
a sense amplifier configured to perform one or more operations on each of the first digit line and the second digit line, wherein the sense amplifier is configured to access the second digit line through the passing digit line.

20. The apparatus of claim 19, comprising a vertical contact arranged between the first memory matrix and the second memory matrix and electrically coupled between the passing digit line and the second digit line.

21. The apparatus of claim 19, comprising a selector circuit configured to selectively couple the sense amplifier to each of the first digit line and the second digit line.

22. The apparatus of claim 21, wherein the selector circuit comprises a multiplexor.

23. The apparatus of claim 19, wherein the passing digit line is not electrically coupled to memory cells of the first memory matrix.

24. The apparatus of claim 19, wherein the sense amplifier is arranged closer to the first memory matrix than to the second memory matrix.

* * * * *